US012785815B1

(12) United States Patent
Alnabulsi et al.

(10) Patent No.: US 12,785,815 B1
(45) Date of Patent: Nov. 3, 2026

(54) PRE-CORRECTING FOR NONLINEARITIES IN A TRANSMITTER

(71) Applicant: Marvell Asia Pte Ltd, Singapore (SG)

(72) Inventors: Basel Alnabulsi, Ottawa (CA); Jamal Riani, Sunnyvale, CA (US); Chang-Feng Loi, Singapore (SG); Vishal Giridharan, Milpitas, CA (US); Qiwei Wang, Fremont, CA (US); Michael W. Parkin, Palo Alto, CA (US)

(73) Assignee: Marvell Asia Pte Ltd, Singapore (SG)

( * ) Notice: Subject to any disclaimer, the term of this patent is extended or adjusted under 35 U.S.C. 154(b) by 223 days.

(21) Appl. No.: 18/889,221

(22) Filed: Sep. 18, 2024

Related U.S. Application Data

(60) Provisional application No. 63/658,633, filed on Jun. 11, 2024, provisional application No. 63/539,058, filed on Sep. 18, 2023.

(51) Int. Cl.
*H04B 10/58* (2013.01)
*H03F 1/32* (2006.01)

(52) U.S. Cl.
CPC ........... *H04B 10/58* (2013.01); *H03F 1/3241* (2013.01); *H03F 2201/3233* (2013.01)

(58) Field of Classification Search
CPC .................. H04B 10/58; H03F 1/3241; H03F 2201/3233
See application file for complete search history.

(56) References Cited

U.S. PATENT DOCUMENTS

| | | | | |
|---|---|---|---|---|
| 7,126,519 | B1 * | 10/2006 | Xu | H03M 1/0626 341/145 |
| 10,128,955 | B2 | 11/2018 | Rope | |
| 11,121,955 | B2 | 9/2021 | Riani | |
| 11,218,225 | B1 | 1/2022 | Alnabulsi | |
| 11,368,170 | B1 | 6/2022 | Smith | |
| 11,381,269 | B1 | 7/2022 | Alnabulsi | |
| 11,575,396 | B2 | 2/2023 | Riani | |
| 11,876,649 | B2 | 1/2024 | Wang | |
| 2008/0219392 | A1 | 9/2008 | Riani | |
| 2008/0253438 | A1 | 10/2008 | Riani | |
| 2010/0277236 | A1 * | 11/2010 | Horiguchi | H03F 1/30 330/149 |
| 2023/0171081 | A1 | 6/2023 | Alnabulsi | |

* cited by examiner

*Primary Examiner* — Vineeta S Panwalkar

(57) ABSTRACT

In a transmitter, a digital signal is equalized to generate an equalized signal, the digital signal having data to be transmitted. A transmit path having a digital-to-analog converter (DAC) generate an analog transmit signal corresponding to the equalized signal. The equalized signal is adjusted to pre-correct for nonlinear effects introduced by the transmit path. Adjusting the equalized signal includes retrieving, from a lookup table (LUT), correction values corresponding to respective data patterns in the digital signal, and using the correction values to adjust the equalized signal. Linear estimation circuitry generates estimates of the analog transmit signal based on the digital signal. LUT update circuitry iteratively adjusts entries in the LUT using a comparison of the analog transmit signal and the estimates of the analog transmit signal generated by the linear estimation circuitry.

20 Claims, 6 Drawing Sheets

PRE-CORRECTING FOR NONLINEARITIES IN A TRANSMITTER

CROSS-REFERENCES TO RELATED APPLICATIONS

This application claims the benefit of U.S. Provisional Patent App. No. 63/539,058, entitled "Transmitter Nonlinearity Estimation, Optimization and Minimization," filed on Sep. 18, 2023, and U.S. Provisional Patent App. No. 63/658,633, entitled "Transmitter Nonlinear LUT Auto-Tuning," filed on Jun. 11, 2024. The disclosures of both of the applications referenced above are incorporated herein by reference in their entireties.

FIELD OF TECHNOLOGY

The present disclosure relates generally to communication devices, and more particularly to correcting for nonlinear effects in a transmitter.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

As transmission speeds increase, nonlinear effects caused by analog components of a transmitter become more significant and can adversely affect bit error rates. For example, components such as a digital-to-analog converter (DAC), driver circuitry, etc., of a transmitter can add nonlinear effects to a transmit signal. These nonlinear effects tend to reduce the effective transmission speeds because additional redundancy in the transmit signal is needed to counteract increased errors caused by the nonlinear effects and/or more retransmissions are required. Examples of nonlinear effects include skew and an amplitude varying offset, i.e., an offset to the transmit signal that varies depending on an amplitude of the transmit signal. Some nonlinear effects to a current transmit symbol vary based on which other transmit symbols were transmitted before or after the current transmit symbol.

In some transmitters, nonlinear effects are characterized by design simulations and/or testing during manufacturing, and the transmitter is preconfigured to adjust the transmit signal to account for the nonlinear effects.

SUMMARY

In an embodiment transmission circuitry for communications comprises: an equalizer configured to filter a digital signal to generate an equalized signal, the digital signal having data to be transmitted; a transmit path configured to generate an analog transmit signal corresponding to the equalized signal, the transmit path having a digital-to-analog converter (DAC) coupled to the equalizer; nonlinearity correction circuitry configured to adjust the equalized signal to pre-correct for nonlinear effects introduced by the transmit path, the nonlinearity correction circuitry further configured to adjust the equalized signal based on data patterns in the digital signal, the nonlinearity correction circuitry including a lookup table (LUT) that stores correction values corresponding to respective data patterns; linear estimation circuitry configured to use a linear model to generate estimates of the analog transmit signal based on the digital signal; and LUT update circuitry configured to iteratively adjust entries in the LUT using a comparison of the analog transmit signal and the estimates of the analog transmit signal generated by the linear estimation circuitry.

In another embodiment, a method for correcting for nonlinear effects introduced in a transmitter includes: equalizing, with a digital filter, a digital signal to generate an equalized signal, the digital signal having data to be transmitted; generating, by a transmit path having a digital-to-analog converter (DAC), an analog transmit signal corresponding to the equalized signal; adjusting the equalized signal to pre-correct for nonlinear effects introduced by the transmit path, including retrieving, from a lookup table (LUT), correction values corresponding to respective data patterns in the digital signal and using the correction values to adjust the equalized signal; generating, by linear estimation circuitry, estimates of the analog transmit signal based on the digital signal; and iteratively adjusting, with LUT update circuitry, entries in the LUT using a comparison of the analog transmit signal and the estimates of the analog transmit signal generated by the linear estimation circuitry.

DETAILED DESCRIPTION

In the following description, for the purposes of explanation, numerous specific details are set forth in order to provide a thorough understanding of the present inventive subject matter. It will be apparent, however, that the present inventive subject matter may be practiced without these specific details. In other instances, well-known structures and devices are shown in block diagram form in order to avoid unnecessarily obscuring the present inventive subject matter.

Correcting for nonlinear effects in transmitters can significantly improve effective transmission rates, especially for high speed communications in the hundreds of gigahertz (GHz). In some embodiments described below, a transmitter includes estimation circuitry that estimates nonlinear effects induced in a transmit signal output by the transmitter during operation of the transmitter in the field. The transmitter also includes circuitry that uses the estimates of nonlinear effects to iteratively pre-correct for the nonlinear effects while the transmitter is operating in the field, which counteracts the nonlinear effects and thus mitigates the nonlinear effects, according to some embodiments. Because estimation of and correction for nonlinear effects is performed while the transmitter is operating in the field, nonlinear effects that vary based on operating conditions (e.g., temperature of the transmitter) can be mitigated as operating conditions vary, at least in some embodiments.

Figure 1:
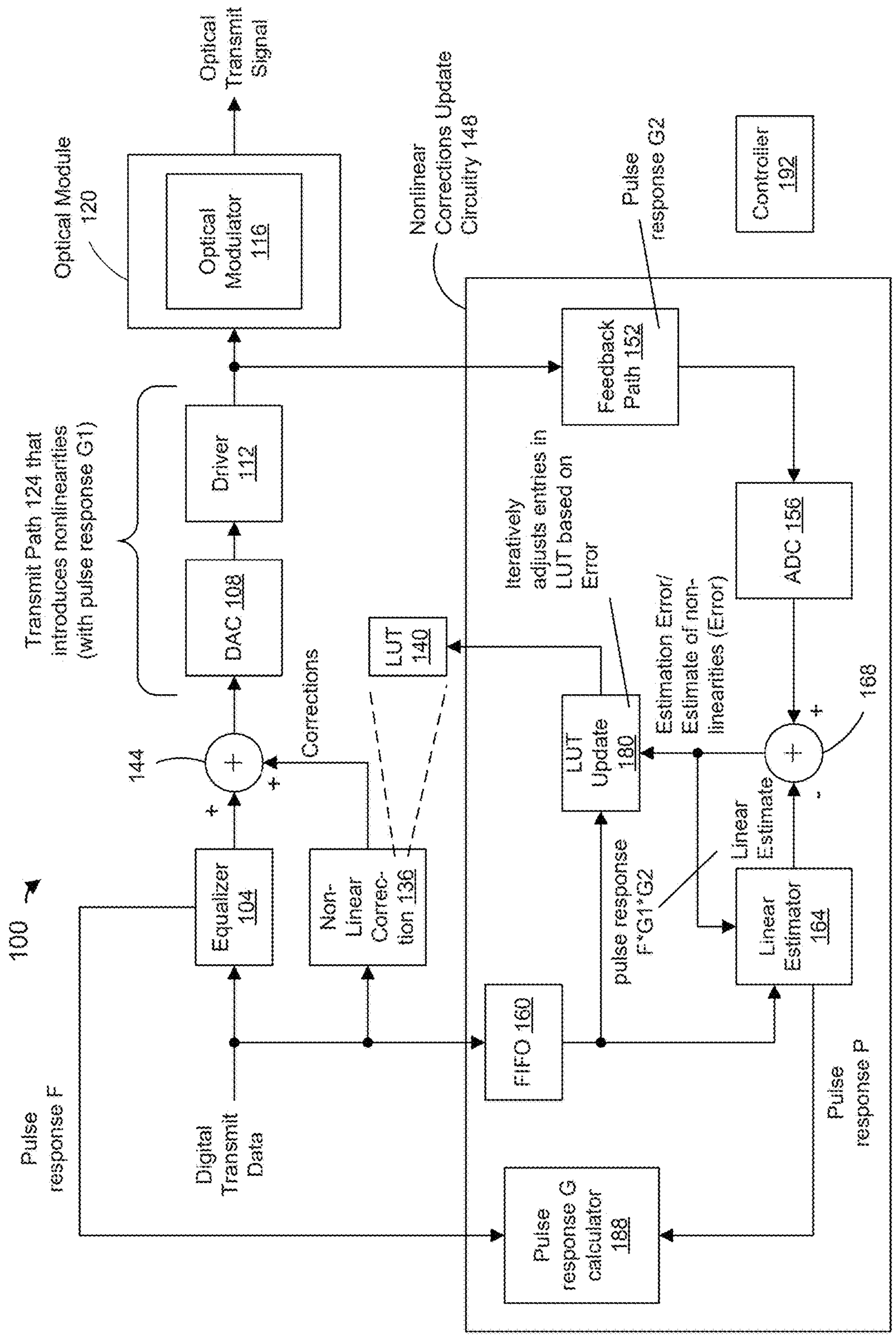
FIG. 1 is a simplified block diagram of an example transmitter that pre-corrects for nonlinear effects in a transmit signal caused by one or more components of the transmitter, according to an embodiment.

FIG. 1 is a simplified block diagram of an example transmitter 100 that is configured to pre-correct for nonlinear effects in a transmit signal caused by one or more components of the transmitter 100, according to an embodiment. As described further below, the transmitter 100 includes estimation circuitry that estimates nonlinear effects in a transmit signal output by the transmitter 100. The transmitter 100 estimates nonlinear effects in a transmit signal output by the transmitter 100 during operation of the transmitter in the field, in some embodiments. The transmitter 100 also includes circuitry that uses the estimates of nonlinear effects to iteratively pre-correct for the nonlinear effects while the transmitter 100, which counteracts the nonlinear effects and thus mitigates the nonlinear effects, according to some embodiments. The transmitter 100 is configured to iteratively pre-correct for the nonlinear effects while the transmitter 100 is operating in the field, in some embodiments.

The transmitter 100 includes an equalizer 104 that receives a digital transmit data signal that is to be transmitted via a communication channel, and is configured to precondition the digital transmit data signal to account for attenuation in the communication channel that varies with frequency, for example, according to an embodiment. In an embodiment, the equalizer 104 comprises a feed forward equalizer (FFE). In other embodiments, the equalizer 104 comprises another suitable equalizer configured to precondition the transmit data signal to account for impairments caused by the communication channel.

The transmitter 100 also includes a digital-to-analog converter (DAC) 108 that is configured to convert the digital transmit data signal (after equalization) to an analog signal. In some embodiments in which the transmitter 100 operates at high data rates, such as in the hundreds of GHz, the DAC 108 comprises an interleaving DAC. In an illustrative embodiment, the DAC 108 comprises an interleaving DAC that operates with four time-interleaved slices. In other embodiments in which the DAC 108 comprises an interleaving DAC, the interleaving DAC operates with a suitable number of time-interleaved slices different than four.

In other embodiments, including other embodiments in which the transmitter 100 operates at data rates in the hundreds of GHz, the DAC 108 comprises a suitable DAC other than an interleaving DAC.

The transmitter 100 also includes driver circuitry 112 that is configured to generate a drive signal suitable for driving an optical modulator 116 of an optical module 120, the optical module 120 configured to generate an optical transmit signal for transmission via a suitable communication medium, such as an optical cable, a waveguide, free space, etc. In other embodiments in which the transmitter 100 is configured to transmit wirelessly, the optical module 120 is replaced with a wireless transmitter and the driver 112 is configured to generate a drive signal suitable for driving the wireless transmitter. In other embodiments in which the transmitter 100 is configured to transmit via an electrical cable, the optical module 120 is omitted and the driver 112 corresponds to a transmitter configured to generate an electrical transmit signal for transmission via an electrical cable, such as a twisted-pair cable, a coaxial cable, etc.

The DAC 108 and the driver circuitry 112 are components of a transmit path 124 that introduces nonlinear effects (sometimes referred to as "nonlinearities") resulting in nonlinearities in the drive signal output of the driver circuitry 112. Examples of nonlinearities introduced by the transmit path 124 include skew and an amplitude varying offset, i.e., an offset to the drive signal that varies depending on an amplitude of the drive signal. As briefly discussed above, some nonlinear effects to a current transmit symbol in the drive signal vary based on which other transmit symbols occurred in the drive signal before or after the current transmit symbol.

The transmitter 100 also includes nonlinear effects correction circuitry 136 that receives the digital transmit data signal and is configured to output corrections based on the digital transmit data signal, the corrections configured to pre-correct the digital transmit data signal in an effort to mitigate the nonlinear effects introduced by the transmit path 124. In an embodiment, nonlinear effects to a current transmit symbol can vary (at least in some instances) based on which other transmit symbols were transmitted before and/or after the current transmit symbol. Thus, the nonlinear effects correction circuitry 136 is configured to detect a pattern in the digital transmit data signal and to generate a correction based on the detected pattern, in some embodiments.

In some embodiments, the nonlinear effects correction circuitry 136 includes a lookup table (LUT) 140 that includes entries having corrections, where at least some of the entries correspond to respective data patterns. In some embodiments, the nonlinear effects correction circuitry 136 is configured to detect a data pattern in the digital transmit data signal, determine one or more entries in the LUT 140 that correspond to the detected data pattern, and retrieve one or more correction values from the determined one or more entries in the LUT 140. For example, in some embodiments in which the DAC 108 includes an interleaving DAC with individual DAC circuits corresponding to respective slices, the nonlinear effects correction circuitry 136 determines multiple entries in the LUT 140 that correspond to the detected data pattern, with the multiple entries corresponding to respective slices corresponding to the individual DAC circuits of the interleaving DAC.

An adder circuit 144 adds the correction output by the nonlinear effects correction circuitry 136 to the digital transmit data signal. In the embodiment of FIG. 1, the adder circuit 144 adds the correction to an output of the equalizer 104.

The transmitter 100 includes nonlinear corrections update circuitry 148 that is configured to update nonlinear correction values in the LUT 140. The nonlinear corrections update circuitry 148 includes a feedback path 152 coupled to an analog-to-digital converter (ADC) 156. In some embodiments, the feedback path 152 is configured to feedback an output of the transmit path 124 for purposes of measuring nonlinearities introduced by the transmit path 124. The feedback path 152 is configured to limit adverse effects on the drive signal received by the optical module 120. In other embodiments in which the optical module 120 is omitted (e.g., for wireless communications, communications via electrical cables, etc.), the feedback path 152 is configured to limit adverse effects on the output signal (generated by the transmit path 124) received by the wireless transmitter, electrical signal transmitter, etc.

In various embodiments, the feedback path 152 includes analog circuitry such as one or more of an analog filter (e.g., an analog lowpass filter, a continuous time linear equalizer (CTLE), etc.), an amplifier (e.g., a variable gain amplifier (VGA)), etc.

The ADC 156 is configured to operate at a sampling rate that is a fraction of the transmission rate of the transmitter 100, according to some embodiments. In some embodiments in which the transmitter 100 generates pulse amplitude modulation (PAM) symbols having M levels (where M is a suitable positive integer), the ADC 156 operates at a sampling rate of K/(M*N) of the baud rate of the transmitter 100, where K and N are suitable positive integers. When a bandwidth of the feedback path 152 is sufficiently high, fewer samples are needed to measure nonlinear effects and thus K can be set to one, according to an embodiment. On the other hand, when the bandwidth of the feedback path 152 is lower, more samples are needed to measure nonlinear effects and thus K is set to a suitable integer greater than one, according to an embodiment. N is a parameter that indicates a number of transmission symbols that are modeled as effecting nonlinearities in a current transmission symbol, according to an embodiment, and is discussed further below.

In an embodiment in which the transmitter 100 generates PAM symbols having four levels, the sampling rate of the ADC 156 is 1/256.5 of the baud rate of the transmitter. In other embodiments, the sampling rate of the ADC 156 is another suitable rate different than 1/256.5 of the baud rate of the transmitter.

A first-in-first-out (FIFO) memory 160 receives the digital transmit signal and outputs a delayed version of the digital transmit signal. A linear estimator 164 is coupled to the FIFO 160 and is configured to develop a linear model (e.g., corresponding to a signal response such as a pulse response, an impulse response, etc.) of a signal channel that includes the equalizer 104, the transmit path 124, and the feedback path 152, according to an embodiment. The linear estimator 164 develops the linear model based on i) the delayed version of the digital transmit signal and ii) an output of the ADC 156, and the FIFO memory 160 has a depth configured to align, in time, the delayed version of the digital transmit signal and the output of the ADC 156 to account for a delay through the equalizer 104, the transmit path 124, the feedback path 152, and the ADC 156, in an embodiment. The linear estimator 164 uses the linear model to generate estimates (sometimes referred to herein as "linear estimates") of the output of the ADC 156, as is described further below.

An adder circuit 168 is configured to calculate a difference (estimation error, sometimes referred to herein as "the error") between the linear estimate output by the linear estimator 164 and the output of the ADC 156. The linear estimator 164 is configured to iteratively adjust the linear model of the linear estimator 164 based on the error in an effort to minimize the error. In an embodiment, the linear model of the linear estimator 164 comprises an FIR filter (not shown), and the linear estimator 164 is configured to iteratively adjust filter coefficients of the FIR filter in an effort to minimize the error. In an embodiment, the linear estimator 164 is configured to implement a least mean squares (LMS) algorithm to adjust the filter coefficients of the FIR filter of the linear estimator 164 based on the error. In other embodiments, the linear estimator 164 adjusts the linear model of the linear estimator 164 based on the error using another suitable algorithm.

The equalizer 104 has a linear pulse response of F, the transmit path 124 has a linear pulse response of G1, and the feedback path 152 has a linear pulse response of G2. Thus, when the linear model of linear estimator 164 converges, the linear model corresponds to an estimate of a pulse response P:

$$P=F*G1*G2 \qquad \text{Equation 1}$$

The linear pulse response G of the transit path 124 and the feedback path 152 corresponds to:

$$G=G1*G2 \qquad \text{Equation 2}$$

A linear pulse response calculator 188 is configured to calculate G based on Equations 1 and 2, and using F (the pulse response of the equalizer 104) and P (the linear model determined by the linear estimator 164). In an embodiment, the linear pulse response calculator 188 generates G to have J coefficients (sometimes referred to herein as "taps"), where J is a suitable positive integer. In an embodiment in which the DAC 108 comprises an interleaving DAC, J is equal to the number of slices according to which the interleaving DAC operates. As an illustrative embodiment, when the interleaving DAC operates according to four slices, J is equal to four.

In an embodiment, when the linear model of linear estimator 164 converges, the error signal output by the adder circuit 168 provides an estimate on nonlinearities in the output of the transmit path 124 that were introduced by the transmit path 124. When the linear model of linear estimator 164 has converged, LUT update circuitry 180 uses the error signal output by the adder circuit 168 to update entries in the LUT 140 in an effort to minimize the error signal. The LUT update circuitry 180 also uses the delayed version of the digital transmit signal (output by the FIFO 160) to update entries in the LUT 140.

In an embodiment, the LUT update circuitry 180 is configured to implement an algorithm similar to an LMS algorithm to adjust entries in the LUT 140 based on the error. In other embodiments, the LUT update circuitry 180 adjusts entries in the LUT 140 based on the error using another suitable algorithm.

Operation of the LUT update circuitry 180 will be described further below.

Figure 2:
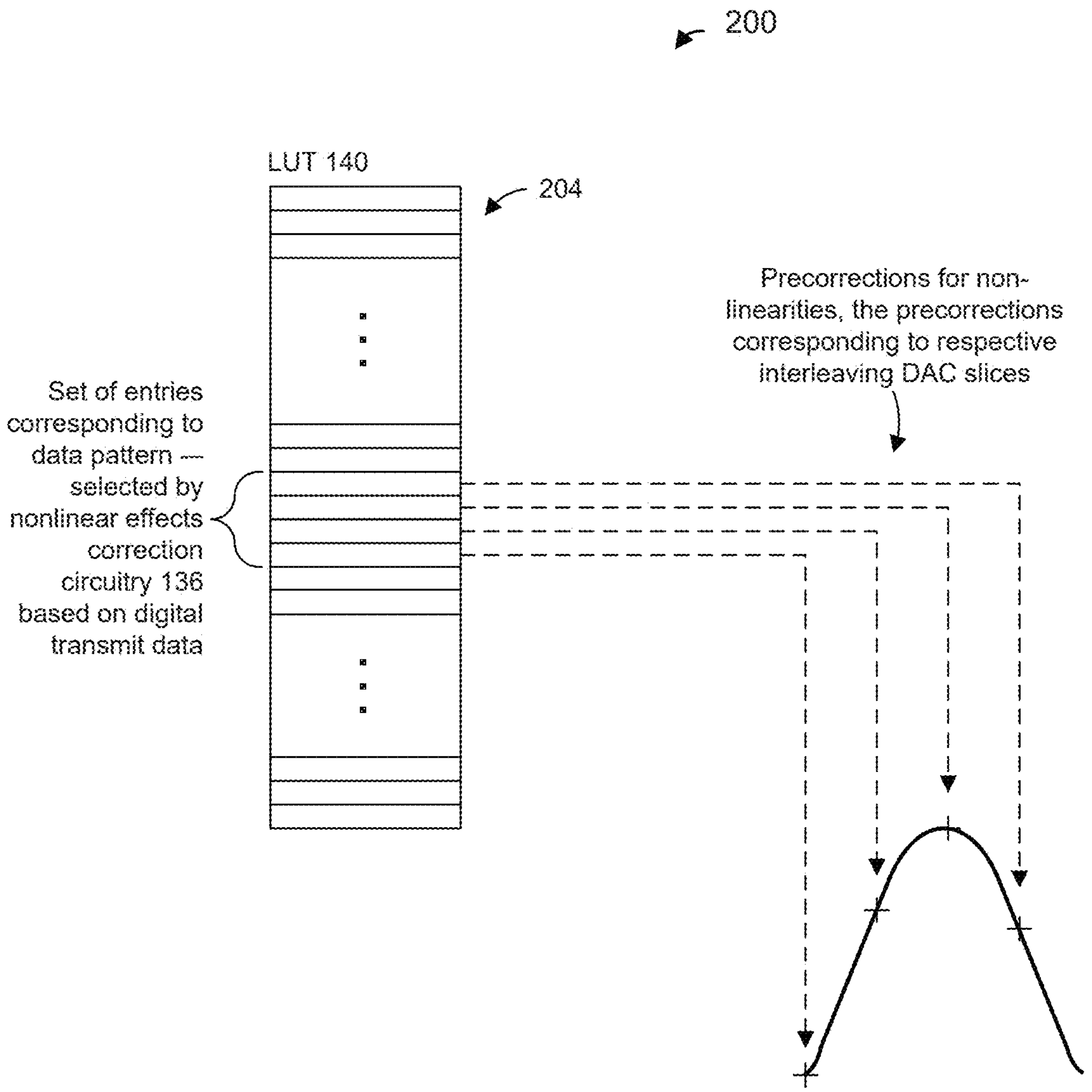
FIG. 2 is a simplified diagram illustrating correction values from a lookup table (LUT) of the transmitter of FIG. 1 being added to a digital signal to pre-correct for nonlinear effects, according to an embodiment.

FIG. 2 is a simplified diagram 200 illustrating correction values from the LUT 140 being added to an output of the equalizer 104, according to an embodiment. FIG. 2 corresponds to the DAC 108 having an interleaving DAC that operates with four time-interleaved slices, according to an embodiment.

The LUT 140 includes entries 204 that include sets of entries 204, each set of entries 204 corresponding to a respective data pattern. In an embodiment, each set of entries 204 includes a quantity of entries 204 that corresponds to a quantity time-interleaved slices with which the interleaving DAC 108 operates. In an embodiment, each set of entries 204 includes a J entries 204, where J is the number of taps of the pulse response estimate G.

In the scenario illustrated in FIG. 2, the nonlinear effects correction circuitry 136 has selected a set of entries 204 that corresponds to a data pattern detected in the digital transmit data by the nonlinear effects correction circuitry 136. The selected set of entries 204 is added to respective output samples of the equalizer 104, in an embodiment.

In some embodiments in which the DAC 108 is not an interleaving DAC, the quantity of entries in each set of entries 204 is one.

In some embodiments, a controller 192 of the transmitter 100 is configured to control operation of the nonlinear corrections update circuitry 148. For example, the controller 192 is configured to selectively enable and disable operation of the nonlinear corrections update circuitry 148, in some embodiments. In an embodiment, the controller 192 is configured to enable operation of the nonlinear corrections update circuitry 148 in response to one or more suitable events, such as one or more of: a powering on of the transmitter 100, a reset of the transmitter 100, a temperature of the transmitter 100 exceeding a threshold, a temperature of the transmitter 100 going below a threshold, a change in temperature of the transmitter 100 exceeding a threshold, a power supply voltage level exceeding a threshold, a power supply voltage level going below a threshold, a change in the power supply voltage level exceeding a threshold, a transition from a power save mode of the transmitter 100 to an active mode of the transmitter 100, etc. In an embodiment, the controller 192 is configured to disable operation of the nonlinear corrections update circuitry 148 in response to one or more suitable events, such as one or more of: determining that correction values in the LUT 140 have converged, determining that a time duration since enabling the nonlinear corrections update circuitry 148 has exceeded a threshold, determining that a timer that measures a time duration since enabling the nonlinear corrections update circuitry 148 has expired, a transition to a power save mode of the transmitter 100, etc.

In an embodiment, enabling the nonlinear corrections update circuitry 148 comprises providing power to the nonlinear corrections update circuitry 148. In an embodiment, disabling the nonlinear corrections update circuitry 148 comprises putting the nonlinear corrections update circuitry 148 in a power save mode in which power to the nonlinear corrections update circuitry 148 is shut down.

In an embodiment, the controller 192 comprises a processor configured to execute machine-readable instructions stored in a memory (not shown) coupled to the processor, where the machine-readable instructions, when executed by the processor, cause the processor to perform operations such as described above. In another embodiment, the controller 192 additionally or alternatively comprises a hardware state machine configured to perform operations such as described above.

Figure 3:
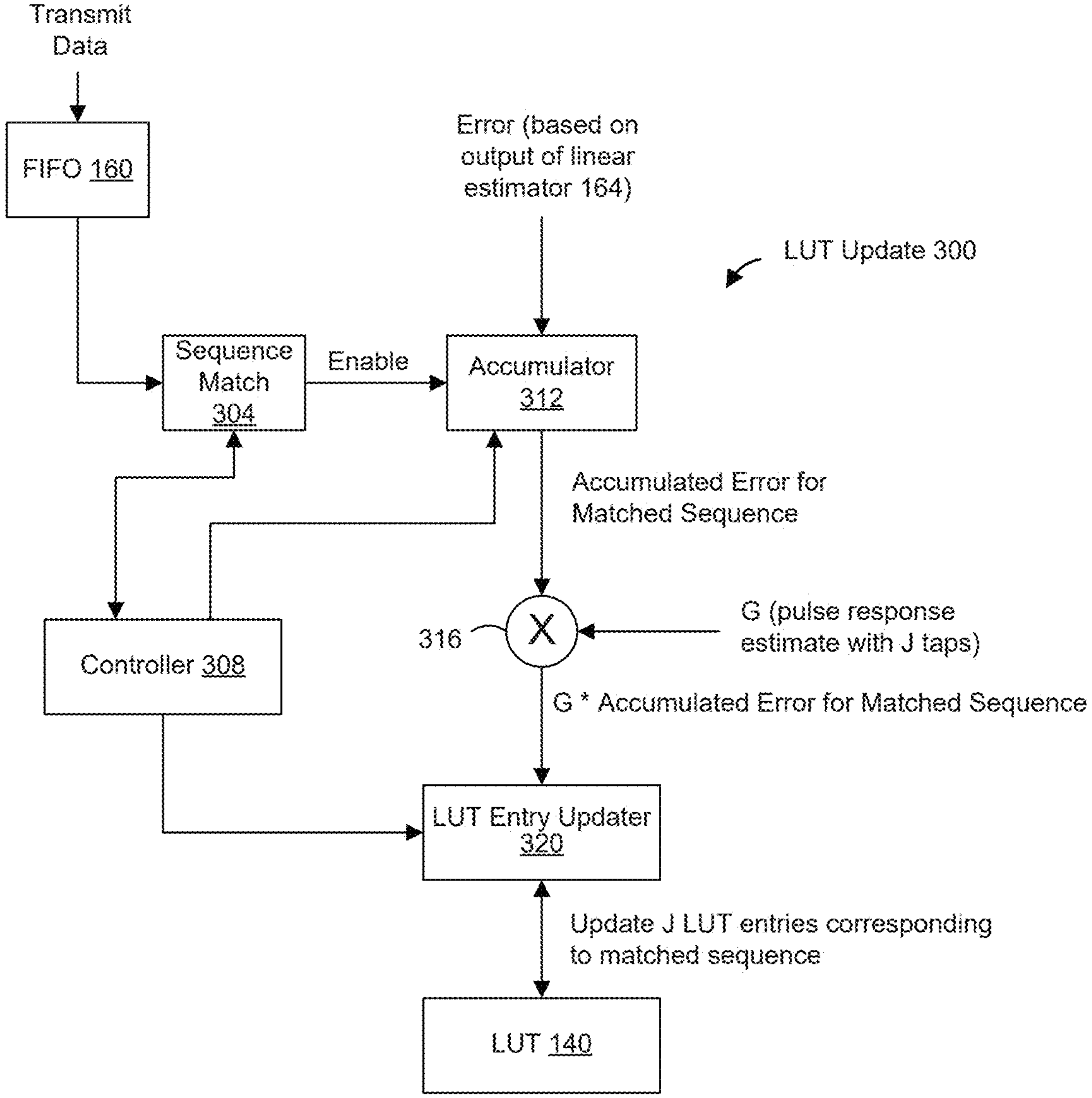
FIG. 3 is a simplified block diagram of example LUT update circuitry of the transmitter of FIG. 1, the LUT update circuitry configured to update a LUT of the transmitter of FIG. 1 used for correcting nonlinearities, according to an embodiment.

FIG. 3 is a simplified block diagram of example LUT update circuitry 300 configured to update a LUT used for correcting nonlinearities in a communication device, according to an embodiment. In an embodiment, the LUT update circuitry 300 is included in the LUT update circuitry 180 of FIG. 1, and FIG. 3 is described with reference to FIG. 1 for ease of explanation. In other embodiments, the LUT update circuitry 180 of FIG. 1 has a suitable structure different than the example LUT update circuitry 300. In some embodiments, the LUT update circuitry 300 is used in other suitable transmitter circuitry different than the example transmitter circuitry 100 of FIG. 1.

The LUT update circuitry 300 includes sequence match detection circuitry 304 that is configured to detect a data sequence in the delayed version of the digital transmit signal output by the FIFO 160 and to generate an output that indicates when the data sequence is detected in the delayed version of the digital transmit signal. In an embodiment, a controller 308 is configured to indicate the data sequence, among a plurality of different data sequences, that the sequence match detection circuitry 304 is configured to detect.

An accumulator 312 accumulates the error (e.g., output by the adder circuit 168) which estimates nonlinearities. The accumulator 112 is enabled by the output of the sequence match detection circuitry 304 so that the accumulator 112 accumulates error values corresponding to the data sequence, and ignores error values when the data sequence is not detected in the delayed version of the digital transmit signal.

A multiplier 316 multiplies an output of the accumulator 312 by the estimate of the linear pulse response G generated by the linear pulse response calculator 188.

A LUT entry updater 320 is configured to update a set of one or more entries in the LUT 140, which correspond to the particular data sequence being detected by the sequence match detection circuitry 304, using the output of the multiplier 316. Operation of the LUT entry updater 320 is described further below.

In an embodiment, the controller 308 is configured to determine when a sufficient quantity of error values corresponding to the particular data sequence have been accumulated by the accumulator 312. For example, the controller 308 determines when a number of times the particular data sequence was detected by the sequence match detection circuitry 304 has met a threshold. In connection with determining that a sufficient quantity of error values corresponding to the particular data sequence have been accumulated by the accumulator 312, the controller 308 controls the sequence match detection circuitry 304 to begin detecting another data sequence among the plurality of different data sequences. Also in connection with determining that the sufficient quantity of error values corresponding to the particular data sequence have been accumulated by the accumulator 312, the controller 308 resets the accumulator 312. Also in connection with determining that the sufficient quantity of error values corresponding to the particular data sequence have been accumulated by the accumulator 312, the controller 308 prompts the LUT entry updater 320 to update the set of one or more entries in the LUT 140, which correspond to the particular data sequence, using the output of the multiplier 316. In an embodiment, the controller 308 provides the LUT entry updater 320 with an address in the LUT that corresponds to the set of one or more entries in the LUT 140. In another embodiment, the controller 308 provides the LUT entry updater 320 with one or more addresses in the LUT that correspond to the one or more entries in the set.

In an embodiment in which each data pattern corresponds to J entries in the LUT 140, the LUT entry updater 320 updates the J entries according to the following procedure:

```
For IDX=1 to J
    Retrieve NL of entry from base_address+IDX−1
    NL=NL−μ*Accumulated_Error*G [IDX]
    Store NL to base-address+IDX−1
End
```

wherein IDX is an index that corresponds to a tap of the pulse response G, NL is a nonlinear correction value, base_address is a base address in the LUT 140 corresponding to the set of one or more entries that correspond to the matching data pattern, Accumulated_Error is the output of the accumulator 312, G [IDX] is a tap of the pulse response G as indexed by IDX, and μ is a step size parameter that controls an amount by which an NL values can be changed at each iteration.

Figure 4:
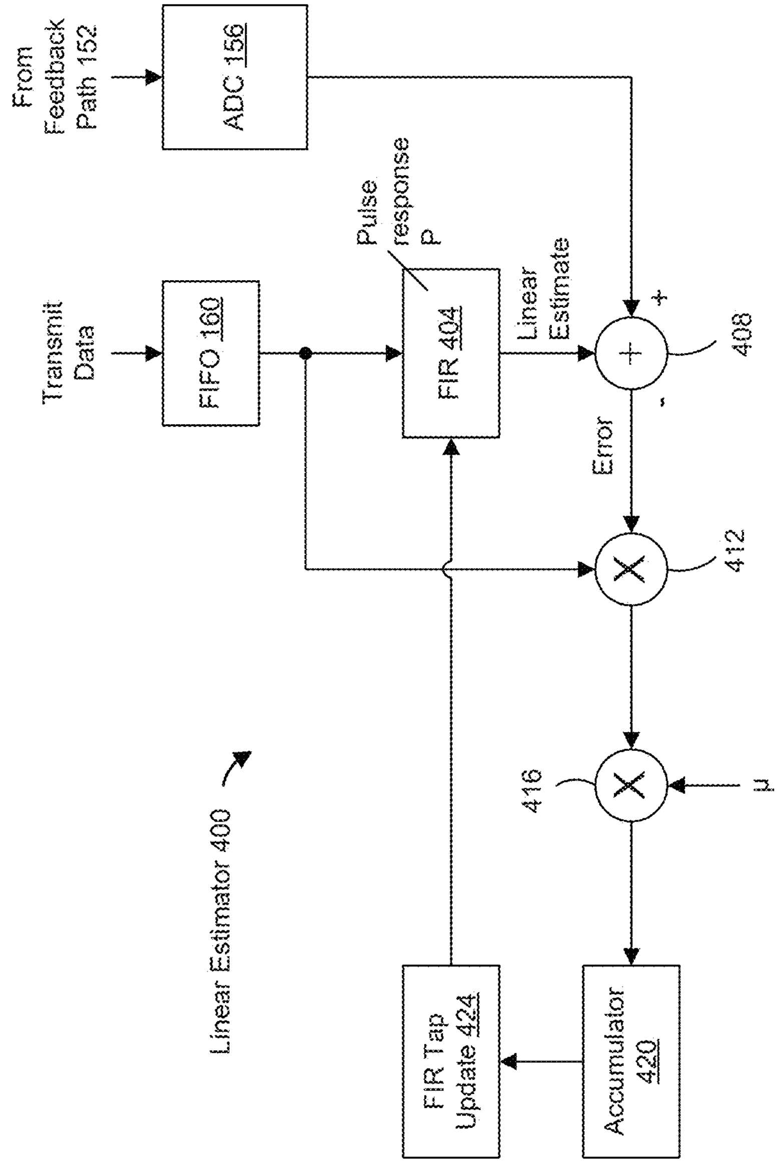
FIG. 4 is a simplified block diagram of an example linear estimator of the transmitter of FIG. 1 that generates a linear estimate of a signal response corresponding to a transmit path of the transmitter, according to an embodiment.

FIG. 4 is a simplified block diagram of an example linear estimator 400 configured to generate a linear estimate of a signal response corresponding to a transmitter, according to an embodiment. In an embodiment, the linear estimator 400 is included in the linear estimator 164 of FIG. 1, and FIG. 4 is described with reference to FIG. 1 for ease of explanation. In other embodiments, the linear estimator 164 of FIG. 1 has a suitable structure different than the example linear estimator 400. In some embodiments, the linear estimator 400 is used in other suitable transmitter circuitry different than the example transmitter circuitry 100 of FIG. 1.

The linear estimator 400 is configured to generate a linear estimate of a signal response (e.g., a pulse response, an impulse response, etc.) through an equalizer (e.g., the equalizer 104), a transmit path (e.g., the transmit path 124), and a feedback path (e.g., the feedback path 152) of a transmitter, according to an embodiment. The linear estimator 400 generates the linear estimate based on i) a delayed version of a digital transmit signal (e.g., an output of the FIFO 160) and ii) an output of an output of an ADC (e.g., the ADC 156) that samples the feedback path, in an embodiment.

The linear estimator 400 includes an FIR filter 404 that corresponds to a linear model (e.g., corresponding to a signal response such as a pulse response, an impulse response, etc.) of a signal channel that includes the equalizer 104, the transmit path 124, and the feedback path 152, according to an embodiment. The linear estimator 400 applies the delayed version of a digital transmit signal to the FIR filter 404 to generate the estimate of the output of the ADC 156.

An adder circuit 408 is configured to calculate a difference ("the error") between the linear estimate output by the FIR filter 404 and the output of the ADC 156. A multiplier 412 multiplies the error by the delayed version of a digital transmit signal. A multiplier 416 multiplies an output of the multiplier 412 by a step size parameter u. The step size parameter u of FIG. 400 is different than the step size parameter u described with reference to FIG. 3, in some embodiments.

An accumulator 420 accumulates outputs of the multiplier 416 over a suitable number of samples. The accumulator 420 accumulates outputs of the multiplier 416 over a number of samples that corresponds to the number of taps of the FIR filter 404, in an embodiment.

A FIR filter tap updater 424 uses accumulated outputs of the multiplier 416 to iteratively adjust taps of the FIR filter 404. In an embodiment, the FIR filter tap updater 424 is configured to implement an LMS algorithm to adjust the filter coefficients of the FIR filter 404 based on the output of the accumulator 420. In other embodiments, the FIR filter tap updater 424 adjusts the filter coefficients of the FIR filter 404 based on the output of the accumulator 420 using another suitable algorithm.

Figure 5:
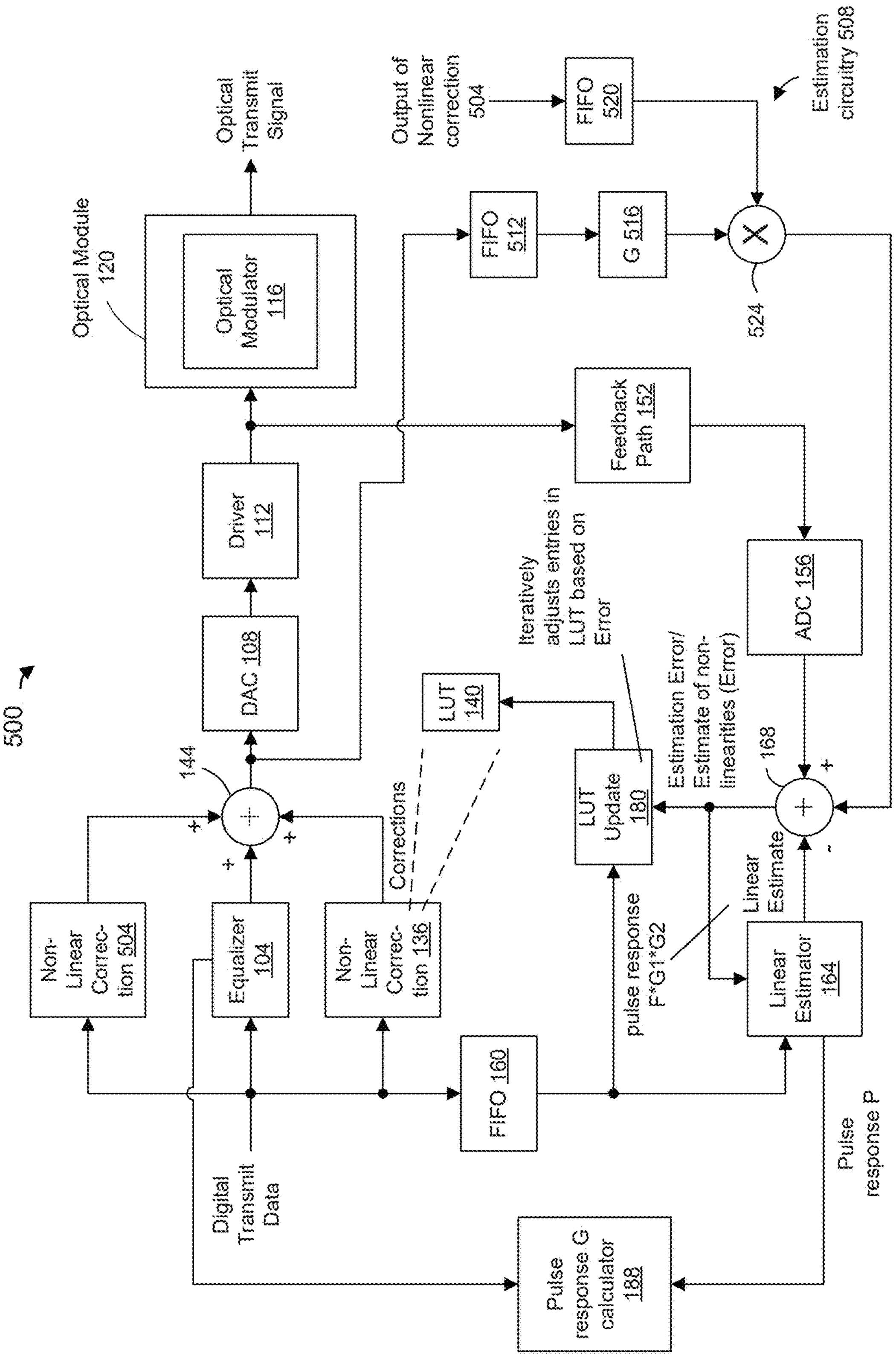
FIG. 5 is a simplified block diagram of another example transmitter that pre-corrects for different nonlinear effects in a transmit signal caused by components of or coupled to the transmitter and/or a channel medium, according to another embodiment.

FIG. 5 is a simplified block diagram of another example transmitter 500 that is configured to pre-correct for nonlinear effects in a transmit signal caused by one or more components of the transmitter 500, according to another embodiment. The transmitter 500 is similar to the transmitter 100 of FIG. 1, and like-numbered elements are not described again in detail for purposes of brevity.

The transmitter 500 includes nonlinear effects correction circuitry 504 that receives the digital transmit data signal and is configured to output corrections based on the digital transmit data signal, the corrections configured to pre-correct the digital transmit data signal in an effort to mitigate the nonlinear effects introduced by components other than the transmit path 154, such as nonlinear effects introduced by the optical module 120, a communication channel, etc. In an embodiment, nonlinear effects to a current transmit symbol can vary (at least in some instances) based on which other transmit symbols were transmitted before and/or after the current transmit symbol. Thus, the nonlinear effects correction circuitry 504 is configured to detect a pattern in the digital transmit data signal and generate a correction based on the detected pattern, in some embodiments.

In some embodiments, the nonlinear effects correction circuitry 504 includes a LUT (not shown) similar to the LUT 140, but separate from the LUT. In some embodiments, a single physical LUT stores both the LUT 140 and the LUT of the nonlinear effects correction circuitry 504.

The adder circuit 144 also adds the correction output by the nonlinear effects correction circuitry 504 to the digital transmit data signal. In the embodiment of FIG. 5, the adder circuit 144 adds the correction to the output of the equalizer 104 and the output of the nonlinear effects correction circuitry 136.

The transmitter 500 also includes estimation circuitry 508 that is configured to generate an estimate of a contribution by the correction output by the nonlinear effects correction circuitry 504 to the signal output by the ADC 156. The estimation circuitry 508 includes a FIFO 512 that receives an output of the equalizer 104 and outputs a delayed version of the output of the equalizer 104. Circuitry 516 is configured to apply the pulse response G to the output of the FIFO 512.

A FIFO 520 receives an output of the nonlinear effects correction circuitry 504. A multiplier 524 multiplies an output of the circuitry 516 with an output of the FIFO 520 to generate an estimate of the contribution by the correction output by the nonlinear effects correction circuitry 504 to the signal output by the ADC 156. The FIFO 512 and the FIFO 520 have respective depths configured to align, in time, the delayed version of the output of the equalizer 504 and the output of the nonlinear effects correction circuitry 504 to account for a delay through the transmit path 124, the feedback path 152, and the ADC 156, in an embodiment.

The adder circuit 168 is configured to subtract the output multiplier 524 from the output of the ADC 156, which removes the estimate of the contribution by the correction output by the nonlinear effects correction circuitry 504 from the output of the ADC 156. In this manner, the LUT update circuitry 180 operates to adjust the entries of the LUT 140 without regard to the corrections added by the nonlinear effects correction circuitry 504, and which prevents the LUT update circuitry 180 from trying to correct for nonlinearities intentionally added by the nonlinear effects correction circuitry 504, at least in some embodiments.

Figure 6:
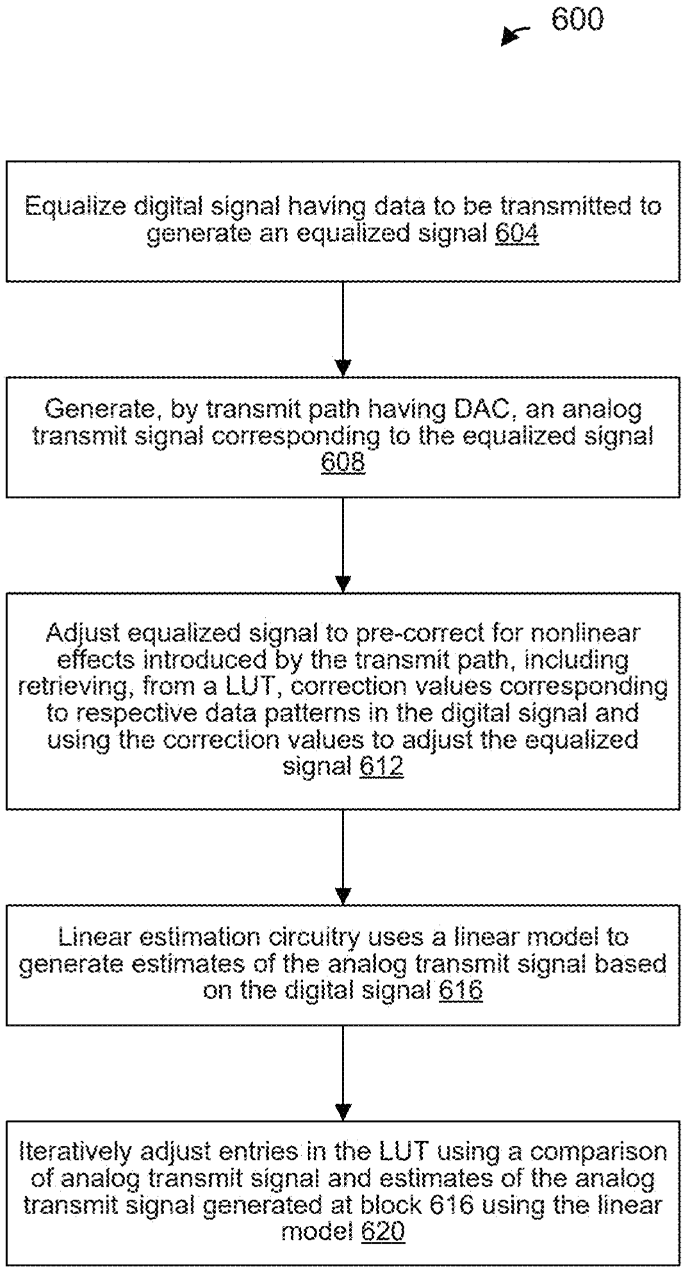
FIG. 6 is a simplified flow diagram of an example method for correcting for nonlinear effects introduced in a transmitter such as the transmitter of FIG. 1, according to an embodiment.

FIG. 6 is a flow diagram of an example method 600 for correcting for nonlinear effects introduced in a transmitter, according to an embodiment. The method 600 is implemented by the transmitter 100 of FIG. 1, in an embodiment, and the method 600 is described with reference to FIG. 1 for ease of explanation. In another embodiment, the method 600 is implemented by the transmitter 500 of FIG. 5. In other embodiments, the method 600 is implemented by another suitable transmitter different than the example transmitters of FIGS. 1 and 5. In some embodiments, the transmitters of FIGS. 1 and 5 implement another suitable method different than the method 600.

At block 604, a digital signal having data to be transmitted is equalized to generate an equalized signal. For example, the equalizer 104 processes generates the digital signal to generate the equalized signal.

At block 608, a transmit path having a digital-to-analog converter (DAC) generates an analog transmit signal corresponding to the equalized signal. For example, the transmit path 124 generates an analog transmit signal.

At block 612, the equalized signal is adjusted to pre-correct for nonlinear effects introduced by the transmit path.

Adjusting the equalized signal at block 612 includes retrieving, from a LUT, correction values corresponding to respective data patterns in the digital signal and using the correction values to adjust the equalized signal. For example, the nonlinear correction circuit 136 retrieves correction values from the LUT and the correction values are added to the equalized signal by the adder circuit 144.

At block 616, linear estimation circuitry uses a linear model to generate estimates of the analog transmit signal based on the digital signal. For example, the linear estimation circuitry 164 uses a linear model to generate estimates of the analog transmit signal based on the digital signal.

At block 620, LUT update circuitry iteratively adjusts entries in the LUT using a comparison of the analog transmit signal and the estimates of the analog transmit signal generated using the linear model. For example, the LUT update circuitry 180 iteratively adjusts entries in the LUT 140 based on an output of the adder circuit 168.

In an embodiment, iteratively adjusting entries in the LUT at block 620 includes: detecting data patterns in the digital signal; and for each of multiple data patterns, updating one or more entries in the LUT that correspond to the data pattern based on estimates of nonlinear effects that coincide with the data pattern.

In another embodiment, iteratively adjusting entries in the LUT at block 620 includes, for each of multiple data patterns: detecting multiple instances of the data pattern in the digital signal; and updating each of one or more entries in the LUT that corresponds to the data pattern based on multiple estimates of nonlinear effects that coincide with the multiple instances of the data pattern.

In an embodiment, using the linear model to generate estimates of the analog transmit signal at block 616 includes: generating, by an FIR filter, the estimates of the analog transmit signal based on the digital signal; and updating coefficients of the FIR using the comparison of the analog transmit signal and the estimates of the analog transmit signal generated by the FIR filter. For example, the FIR filter 404 generates estimates of the output of the ADC 156, and the FIR tap update circuitry updates coefficients of the FIR 414 using an output of the adder circuit 408, according to an embodiment.

At least some of the various blocks, operations, and techniques described above are suitably implemented utilizing dedicated hardware, such as one or more of discrete components, an integrated circuit, an ASIC, a programmable logic device (PLD), a processor executing firmware instructions, a processor executing software instructions, or any combination thereof. When implemented utilizing a processor executing software or firmware instructions, the software or firmware instructions may be stored in any suitable computer readable memory such as in a random access memory (RAM), a read-only memory (ROM), a solid state memory, etc. The software or firmware instructions may include machine readable instructions that, when executed by one or more processors, cause the one or more processors to perform various acts described herein.

While the present invention has been described with reference to specific examples, which are intended to be illustrative only and not to be limiting of the invention, changes, additions and/or deletions may be made to the disclosed embodiments without departing from the scope of the invention.

What is claimed is:

1. Transmission circuitry for communications, comprising:

an equalizer configured to filter a digital signal to generate an equalized signal, the digital signal having data to be transmitted;

a transmit path configured to generate an analog transmit signal corresponding to the equalized signal, the transmit path having a digital-to-analog converter (DAC) coupled to the equalizer;

nonlinearity correction circuitry configured to adjust the equalized signal to pre-correct for nonlinear effects introduced by the transmit path, the nonlinearity correction circuitry further configured to adjust the equalized signal based on data patterns in the digital signal, the nonlinearity correction circuitry including a lookup table (LUT) that stores correction values corresponding to respective data patterns;

linear estimation circuitry configured to generate estimates of the analog transmit signal based on the digital signal; and LUT update circuitry configured to iteratively adjust entries in the LUT using a comparison of the analog transmit signal and the estimates of the analog transmit signal generated by the linear estimation circuitry.

2. The transmission circuitry of claim 1, wherein the LUT update circuitry is configured to detect data patterns in the digital signal; and for each of multiple data patterns, update one or more entries in the LUT that corresponds to the data pattern based on estimates of nonlinear effects that coincide with the data pattern.

3. The transmission circuitry of claim 1, wherein the LUT update circuitry is configured to, for each of multiple data patterns:

detect multiple instances of the data pattern in the digital signal; and update each of one or more entries in the LUT that corresponds to the data pattern based on multiple estimates of nonlinear effects that coincide with the multiple instances of the data pattern.

4. The transmission circuitry of claim 3, wherein the LUT update circuitry is configured to, for each of multiple data patterns:

update the one or more entries in the LUT that corresponds to the data pattern based on an accumulation of multiple estimates of nonlinear effects that coincide with the multiple instances of the data pattern.

5. The transmission circuitry of claim 1, wherein the linear estimation circuitry comprises:

a finite impulse response (FIR) filter configured to generate the estimates of the analog transmit signal based on the digital signal; and circuitry configured to update coefficients of the FIR using the comparison of the analog transmit signal and the estimates of the analog transmit signal generated by the FIR filter.

6. The transmission circuitry of claim 5, wherein the circuitry configured to update coefficients of the FIR is further configured to:

calculate respective differences between multiple digital samples of the analog transmit signal and multiple estimates of the analog transmit signal generated by the FIR filter;

accumulate multiple ones of the respective differences; and update coefficients of the FIR using the accumulated multiple ones of the respective differences.

7. The transmission circuitry of claim 1, wherein the transmit path further includes analog circuitry configured to process an output of the DAC to generate the analog transmit signal.

8. The transmission circuitry of claim 7, wherein the analog circuitry comprises:

a driver circuit configured to generate, based on the output of the DAC, the analog transmit signal to drive a modulator.

9. The transmission circuitry of claim 1, wherein the LUT update circuitry comprises:

a feedback path coupled to the transmit path; and an analog-to-digital converter (ADC) that samples an output of the feedback path;

wherein the linear estimation circuitry is configured to use a linear model to generate estimates of the analog transmit signal as estimates of outputs of the ADC; and wherein the LUT update circuitry is configured to iteratively adjust entries in the LUT using a comparison of outputs of the ADC and the estimates of outputs of the ADC generated using the linear model.

10. The transmission circuitry of claim 9, wherein the nonlinearity correction circuitry is first nonlinearity correction circuitry configured to adjust the equalized signal to pre-correct for first nonlinear effects introduced by the transmit path, and wherein the transmission circuitry further comprises:

second nonlinearity correction circuitry configured to adjust the equalized signal to pre-correct for second nonlinear effects introduced by another one or more components of, or coupled to, the transmission circuitry, the other one or more components being distinct from the transmit path;

nonlinear estimation circuitry configured to generate estimates of the second nonlinear effects in the outputs of the ADC;

adder circuitry configured to subtract the estimates of second nonlinear effects from the outputs of the ADC;

wherein the LUT update circuitry is configured to iteratively adjust entries in the LUT using a comparison of i) outputs of the ADC after subtraction of the estimates of the second nonlinear effects, and ii) the estimates of outputs of the ADC generated using the linear model.

11. A method for correcting for nonlinear effects introduced in a transmitter, the method comprising:

equalizing, with a digital filter, a digital signal to generate an equalized signal, the digital signal having data to be transmitted;

generating, by a transmit path having a digital-to-analog converter (DAC), an analog transmit signal corresponding to the equalized signal;

adjusting the equalized signal to pre-correct for nonlinear effects introduced by the transmit path, including retrieving, from a lookup table (LUT), correction values corresponding to respective data patterns in the digital signal and using the correction values to adjust the equalized signal;

generating, by linear estimation circuitry, estimates of the analog transmit signal based on the digital signal; and iteratively adjusting, with LUT update circuitry, entries in the LUT using a comparison of the analog transmit signal and the estimates of the analog transmit signal generated by the linear estimation circuitry.

12. The method for correcting for nonlinear effects of claim 11, wherein iteratively adjusting entries in the LUT comprises:

detecting data patterns in the digital signal; and for each of multiple data patterns, updating one or more entries in the LUT that correspond to the data pattern based on estimates of nonlinear effects that coincide with the data pattern.

13. The method for correcting for nonlinear effects of claim 11, wherein iteratively adjusting entries in the LUT comprises, for each of multiple data patterns:

detecting multiple instances of the data pattern in the digital signal; and updating each of one or more entries in the LUT that corresponds to the data pattern based on multiple estimates of nonlinear effects that coincide with the multiple instances of the data pattern.

14. The method for correcting for nonlinear effects of claim 13, wherein iteratively adjusting entries in the LUT comprises, for each of multiple data patterns:

updating each of one or more entries in the LUT that corresponds to the data pattern based on an accumulation of multiple estimates of nonlinear effects that coincide with the multiple instances of the data pattern.

15. The method for correcting for nonlinear effects of claim 11, wherein generating estimates of the analog transmit signal comprises:

generating, by a finite impulse response (FIR) filter, the estimates of the analog transmit signal based on the digital signal; and updating coefficients of the FIR using the comparison of the analog transmit signal and the estimates of the analog transmit signal generated by the FIR filter.

16. The method for correcting for nonlinear effects of claim 15, wherein generating estimates of the analog transmit signal further comprises:

calculating respective differences between multiple digital samples of the analog transmit signal and multiple estimates of the analog transmit signal generated by the FIR filter;

accumulating multiple ones of the respective differences; and updating coefficients of the FIR using the accumulated multiple ones of the respective differences.

17. The method for correcting for nonlinear effects of claim 11, further comprising:

processing, by analog circuitry, an output of the DAC to generate the analog transmit signal.

18. The method for correcting for nonlinear effects of claim 17, wherein processing the output of the DAC comprises:

processing, by a driver circuit, the output of the DAC to generate the analog transmit signal to drive a modulator.

19. The method for correcting for nonlinear effects of claim 11, further comprising:

sampling, by an analog-to-digital converter (ADC), an output of a feedback path that is coupled to the transmit path;

wherein generating estimates of the analog transmit signal comprises using a linear model to generate estimates of outputs of the ADC based on the digital signal; and wherein iteratively adjusting entries in the LUT comprises iteratively adjusting entries in the LUT using a comparison of outputs of the ADC and the estimates of outputs of the ADC generated using the linear model.

20. The method for correcting for nonlinear effects of claim 19, wherein the nonlinear effects introduced by the transmit path are first nonlinear effects, and wherein the method further comprises:

adjusting the equalized signal to pre-correct for second nonlinear effects introduced by another one or more components of, or coupled to, the transmission circuitry, the other one or more components being distinct from the transmit path;

generating, by nonlinear estimation circuitry, estimates of second nonlinear effects in the outputs of the ADC; and subtracting the estimates of the second nonlinear effects from the outputs of the ADC;

wherein iteratively adjusting entries in the LUT comprises iteratively adjusting entries in the LUT using a comparison of i) outputs of the ADC after subtraction of the estimates of the second nonlinear effects, and ii) the estimates of outputs of the ADC generated using the linear model.

* * * * *